United States Patent
Vandentop et al.

(10) Patent No.: US 7,826,694 B2
(45) Date of Patent: Nov. 2, 2010

(54) ELECTRICAL/OPTICAL INTEGRATION SCHEME USING DIRECT COPPER BONDING

(75) Inventors: Gilroy J. Vandentop, Tempe, AZ (US); Jun-Fei Zheng, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 209 days.

(21) Appl. No.: 12/002,274

(22) Filed: Dec. 13, 2007

(65) Prior Publication Data

US 2008/0135965 A1    Jun. 12, 2008

Related U.S. Application Data

(62) Division of application No. 11/488,389, filed on Jul. 14, 2006, now Pat. No. 7,359,591, which is a division of application No. 10/020,911, filed on Dec. 19, 2001, now abandoned.

(51) Int. Cl.
G02B 6/12 (2006.01)
H01L 21/00 (2006.01)

(52) U.S. Cl. ......................... 385/14; 438/31

(58) Field of Classification Search .......... 438/27, 438/29, 31, 32, 107, 109, 455; 385/14
See application file for complete search history.

(56) References Cited

U.S. PATENT DOCUMENTS

| | | | |
|---|---|---|---|
| 3,744,120 A | 7/1973 | Burgess et al. | |
| 5,426,849 A | 6/1995 | Kimbara et al. | |
| 6,060,795 A * | 5/2000 | Azotea et al. | 307/150 |
| 6,097,609 A | 8/2000 | Kabadi | |
| 6,107,118 A | 8/2000 | Aschenbrenner et al. | |
| 6,204,164 B1 | 3/2001 | Orchard-Webb | |
| 6,243,509 B1 | 6/2001 | Chen | |
| 6,512,861 B2 * | 1/2003 | Chakravorty et al. | 385/14 |
| 7,306,689 B2 * | 12/2007 | Okubora et al. | 156/239 |
| 2002/0076130 A1 | 6/2002 | Pandraud | |
| 2003/0113947 A1 | 6/2003 | Vandentop et al. | |

FOREIGN PATENT DOCUMENTS

| | | |
|---|---|---|
| AU | 02/359506 | 7/2003 |
| CN | 1 605 123 A | 4/2005 |

(Continued)

OTHER PUBLICATIONS

Fan, A. et al., "Copper Wafer Bonding," Electrochemical and Solid-State Letters, 2(10) 534-536 (1999).

(Continued)

*Primary Examiner*—Charlie Peng
(74) *Attorney, Agent, or Firm*—Blakely, Sokoloff, Taylor & Zafman LLP

(57) ABSTRACT

An electro-optic semiconductor package and fabrication method provides enhanced performance. An integrated circuit (IC) having one or more IC contact pads is provided, where the IC contact pads are connected to an IC on the IC wafer. An intermediate wafer having one or more intermediate contact pads is provided, where the intermediate contact pads are connected to an electro-optic arrangement on the intermediate wafer. The method further provides for direct copper bonding the IC contact pads to adjacent intermediate contact pads such that an electro-optic semiconductor package results.

3 Claims, 4 Drawing Sheets

FOREIGN PATENT DOCUMENTS

| | | |
|---|---|---|
| EP | 0 352 020 | 1/1990 |
| EP | 0 801 423 A3 | 10/1997 |
| EP | 1 041 418 A2 | 10/2000 |
| EP | 1 456 879 | 9/2004 |
| WO | WO 92/11113 | 9/1992 |
| WO | WO 01/61743 A1 | 8/2001 |
| WO | WO 03/054954 | 7/2003 |

OTHER PUBLICATIONS

Rahman, A. et al., "Comparison of key Performance Metrics in Two- and Three-Dimensional Integrated Circuits", International Interconnect Technology Conference (IITC), Jun. 2000.

PCT Search report dated Jan. 26, 2004.

* cited by examiner

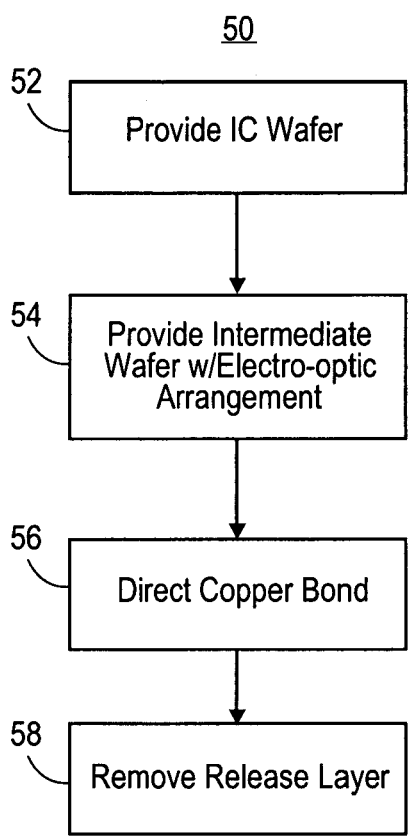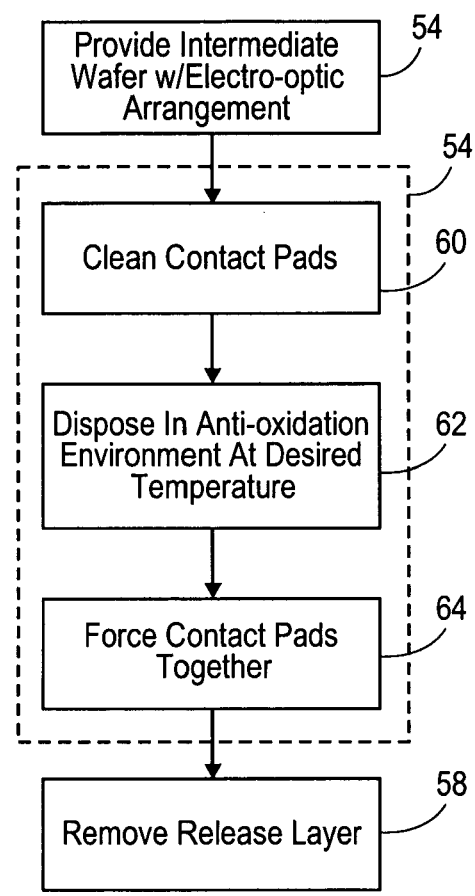
FIG. 3
FIG. 4

ELECTRICAL/OPTICAL INTEGRATION SCHEME USING DIRECT COPPER BONDING

CROSS REFERENCE TO RELATED APPLICATION

This is a Divisional application of Ser. No.: 11/488,389 filed Jul. 14, 2006, now U.S. Pat. No. 7,359,591, which is presently pending, which is a Divisional application of Ser. No. 10/020,911 filed Dec. 19, 2001 which is abandoned.

BACKGROUND OF THE INVENTION

1. Technical Field

The present invention generally relates to semiconductor packages. More particularly, the invention relates to a semiconductor package and fabrication method that uses direct copper bonding to enhance performance and provide electro-optic connectivity.

2. Discussion

In the highly competitive computer industry, the trend toward higher processing speeds and increased functionality is well documented. While this trend is desirable to the consumer, it presents significant challenges to circuit designers as well as manufacturers. A particular area of concern relates to the design of semiconductor packages.

In a typical computing environment, an integrated circuit (IC) such as a processor is encapsulated in a dielectric material to form a semiconductor die (or IC wafer). The IC wafer often has various IC contact pads that connect to the components of the IC by way of vertically extending vias and horizontally extending wires or traces. In order to electrically connect the closely spaced IC contact pads to the various traces of an adjacent printed wiring board (PWB) such as a motherboard, a number of techniques have been used. One approach is to connect an intermediate wafer such as a chip interposer or host wafer to the IC wafer in order to form a larger and more manageable semiconductor package. The intermediate wafer has one or more intermediate contact pads providing through-connection to the board side of the intermediate wafer. Metalized vias are typically used to provide the above described through-connection. One conventional approach to connecting the two wafers is to use an indirect connection approach such as controlled collapse chip connection (C4). If the intermediate wafer has a socketable interconnection mechanism such as pins or ball grid array (BGA) balls, the semiconductor package can be directly mated with a socket that is hardwired to the PWB. Otherwise, a socketable interface is disposed between the semiconductor package and the socket. As processing speeds continue to increase and computing devices continue to shrink in size, the effects of packaging designs on signal throughput have drawn more attention.

One of the more recent developments has been to capitalize upon the bandwidth advantages provided by transmitting signals in the optical domain. Specifically, it has been determined that the use of optics to transfer high speed clock signals as well as input/output (I/O) signals can significantly enhance performance. Conventional semiconductor packages that make use of optics often provide an IC wafer and an intermediate wafer that has an optical arrangement. The optical arrangement will typically include a waveguide and a coupler such as a Bragg grating. The waveguide and coupler therefore provide a mechanism for transporting optical signals between an optical source such as a laser or light emitting diode (LED) and the adjacent IC wafer. It is important to note, however, that processing of the signal often occurs in the electrical domain. This is particularly true in the case of computer processors widely used in the industry. In such cases, it is common to provide a photodetector on the IC wafer that is aligned with the optical coupler during the fabrication process.

While the above-described conventional approach has been satisfactory in some circumstances, certain difficulties remain. One particular difficulty relates to the placement of the optical detector on the IC wafer. Specifically, it has been determined that C4 bonding results in a "gap" between the wafers, and that the gap can lead to a number of problems from an optical standpoint. For example, aligning the optical arrangement with the photodetector requires a significant amount of precision in order to adequately couple the optical energy across the interface between the two wafers. Furthermore, the indirect bonding approach results in gaps on the order of 60 microns that can allow optical energy to escape regardless of how well the wafers are aligned. While the above-described optical losses could be avoided to some degree by placing the optical detector on the intermediate wafer, it has been determined that C4 bonding can also present problems from an electrical standpoint. For example, unwanted interconnect delay, resistance, capacitance, and loop inductance can all result from the C4 balls that are disposed between the IC contact pads and the intermediate contact pads. Thus, manufacturers and designers of conventional electro-optic semiconductor packages are faced with the difficult choice between the optical losses associated with IC wafer placement of the optical detector and the electrical losses associated with intermediate wafer placement of the optical detector.

BRIEF DESCRIPTION OF THE DRAWINGS

FIG. 3 is a flowchart of an example of a method of fabricating an electro-optic semiconductor package in accordance with one embodiment of the present invention;

FIG. 4 is a flowchart of an example of a process of direct copper bonding IC contacts pads to intermediate contact pads in accordance with one embodiment of the present invention.

DETAILED DESCRIPTION

Embodiments of an electro-optic semiconductor package and fabrication method provide enhanced performance. In accordance with one embodiment of the fabrication method, an integrated circuit (IC) wafer having one or more IC contact pads is provided, where the IC contact pads are connected to an IC on the IC wafer. An intermediate wafer having one or more intermediate contact pads is provided, where the intermediate contact pads are connected to an electro-optic arrangement on the intermediate wafer. The method further provides for direct copper bonding the IC contact pads to adjacent intermediate contact pads such that an electro-optic semiconductor package results.

In another embodiment, a method of fabricating an intermediate wafer provides for disposing a waveguide within the intermediate wafer. An optical coupler is positioned adjacent to the waveguide within the intermediate wafer, where the coupler enables transport of an optical signal and one or more intermediate contact pads of the intermediate wafer enable transport of an electrical signal. The method further provides for positioning an electro-optic converter between the optical coupler and the intermediate contact pads such that the converter enables conversion between the optical signal and the electrical signal. The converter may be either an optical detector or an optical emitter.

Further in accordance with embodiments of the present invention, an electro-optic semiconductor package is provided. The semiconductor package includes an IC wafer having one or more IC contact pads, where the IC contact pads are connected to an IC on the IC wafer. An intermediate wafer has one or more intermediate contact pads, where the intermediate contact pads are connected to an electro-optic arrangement on the intermediate wafer. The contact pads form a plurality of direct copper bonds.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
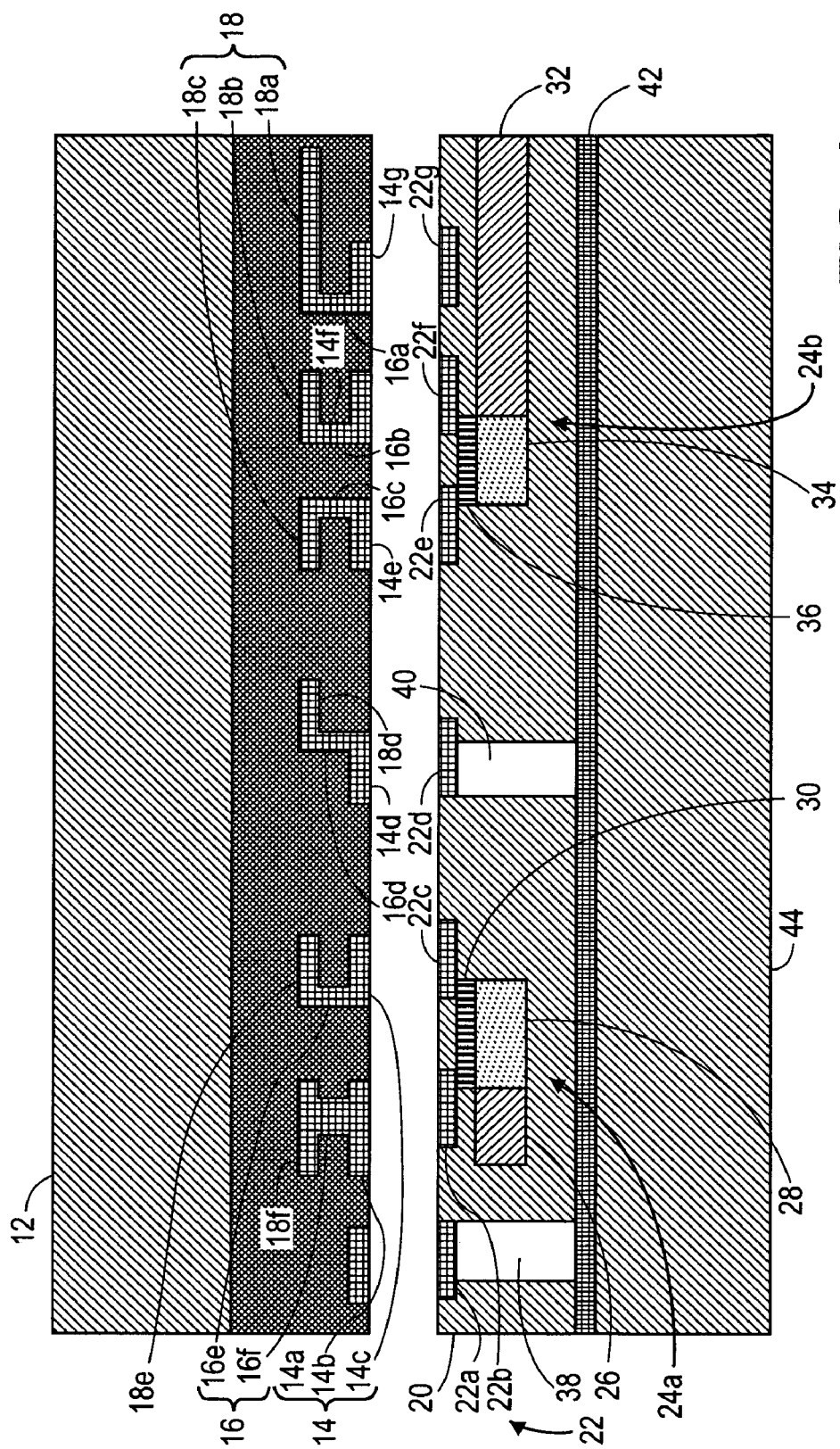
FIG. 1 is a sectional view of an example of an electro-optic semiconductor package before direct copper bonding in accordance with one embodiment of the present invention.
Figure 2:
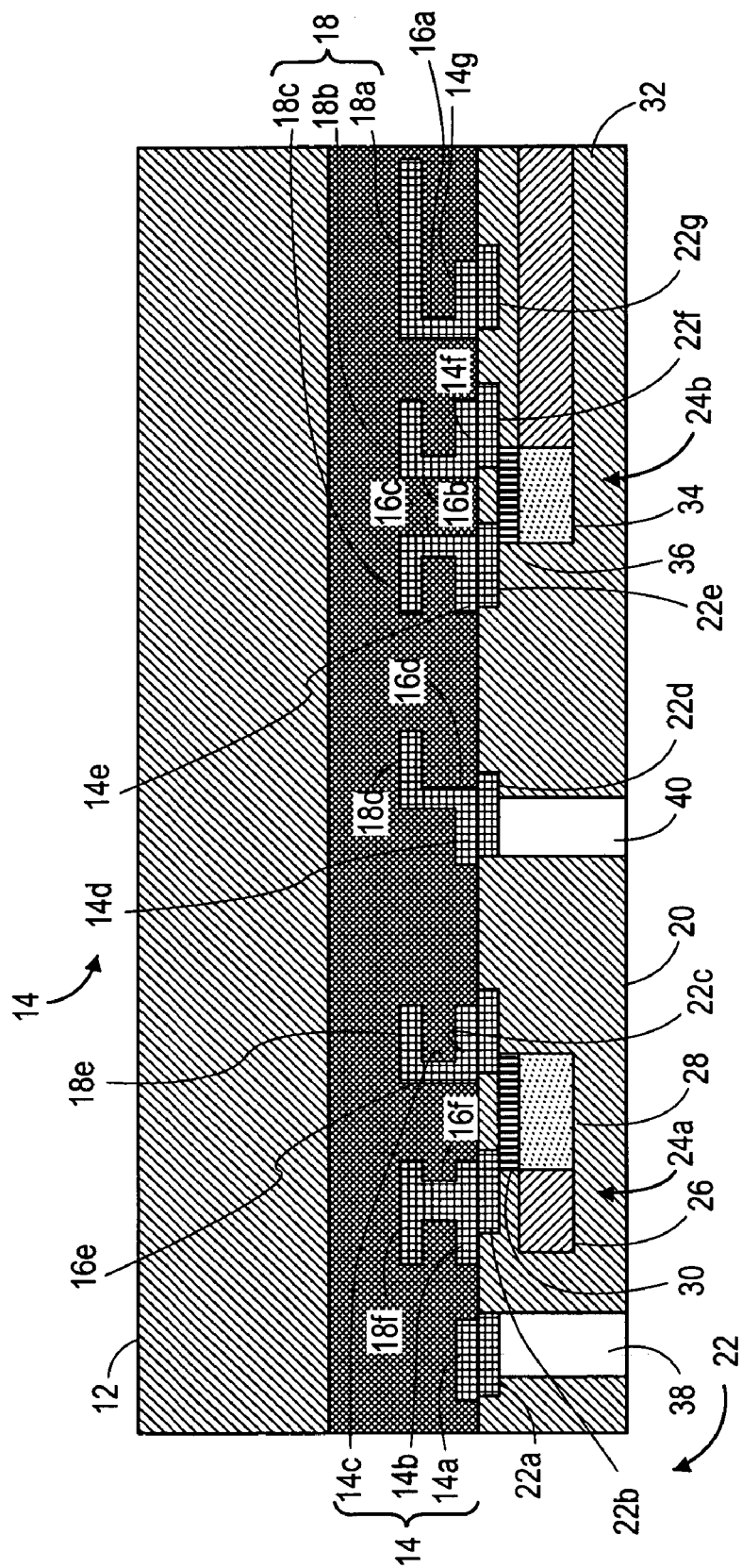
FIG. 2 is a sectional view of an example of an electro-optic semiconductor package after direct copper bonding in accordance with one embodiment of the present invention.

Turning now to FIGS. 1 and 2, an electro-optic semiconductor package is shown before and after the bonding process, respectively. Generally, the completed semiconductor package 10 includes an IC wafer 12 having one or more IC contact pads 14. The IC contact pads 14 are connected to an IC (not shown) on the IC wafer 12 by way of vertically extending vias 16 and horizontally extending wires or traces 18. It will be appreciated that only two levels of interconnection are shown in the IC wafer 12, whereas typically as many as six or more levels may be used. The package further includes an intermediate wafer 20 having one or more intermediate contact pads 22. The intermediate contact pads 22 are connected to an electro-optic arrangement 24 on the intermediate wafer 20. As will be discussed in greater detail below, after fabrication is complete, the contact pads 14, 22 form a plurality of direct copper bonds such that the gap between the two wafers 12, 20 is eliminated. By eliminating the gap between the two wafers 12, 20, a number of performance difficulties can be obviated.

Specifically, the illustrated embodiment of the electro-optic arrangement includes a first arrangement 24a and a second arrangement 24b. The first arrangement 24a has a waveguide 26 disposed within the intermediate wafer 20. An optical coupler 28 is positioned adjacent to the waveguide 26 within the intermediate wafer 20 such that the coupler 28 enables receipt of an optical signal from the waveguide 26. The optical signal can be obtained from any source such as a laser, light emitting diode (LED) or another waveguide. It will be appreciated that the source of the optical signal may also originate from within the intermediate wafer 20 or from an external source. An electro-optic converter such as optical detector 30 is positioned between the optical coupler 28 and one or more of the intermediate contact pads 22 such that the optical detector 30 enables transfer of an electrical signal to the intermediate contact pads based on the optical signal. Optical detectors are well documented in the semiconductor industry and any number of commercially available detectors can be used. In the illustrated embodiment, the optical detector 30 enables transfer of the electrical signal to intermediate contact pads 22b and 22c. The resulting electrical signal may be a clock signal, input/output (I/O) signal, or any other type of signal suitable for transmission in the optical domain. It should be noted, however, that clock and I/O signals typically contain higher frequencies and therefore lend themselves to optical transmission due to bandwidth concerns.

It will further be appreciated that the number, orientation and positioning of the intermediate contact pads 22 depends upon the architecture of the electro-optic arrangement 24 and the particular application in which the semiconductor package 10 is used. It can further be seen that the second arrangement 24b similarly includes a waveguide 32 disposed within the intermediate wafer 20, and an optical coupler 34. The optical coupler 34 is positioned adjacent to the waveguide 32 within the intermediate wafer 20 and enables transmission of an optical signal to the waveguide 32. An electro-optic converter such as optical emitter 36 is positioned between the optical coupler 34 and intermediate contact pads 22e and 22f such that the optical emitter 36 enables transfer of an optical signal to the waveguide 32 based on the electrical signal transported by the intermediate contact pads 22e and 22f. It can be seen that the waveguide 32 extends to an external surface of the intermediate wafer 20 in order to demonstrate the possibility of sending optical signals to external components. Waveguide 26, on the other hand, is shown as extending in a direction that is perpendicular to the waveguide 32 and illustrates the possibility of using other internal light sources. Thus, the electro-optic arrangement 24 can include optical detectors 30, optical emitters 36, or any combination thereof without parting from the spirit and scope of the invention.

It can further be seen that the illustrated intermediate wafer 20 further includes vias 38, 40 that extend through the intermediate wafer 20 to intermediate contact pads 22a and 22d. The vias 38, 40 provide a mechanism for testing certain locations or interconnecting the semiconductor package 10 with other structures such as pin grid arrays (PGAs), ball grid arrays (BGAs), etc. Additionally, the semiconductor package 10 provides a mechanism for facilitating manipulation of the package 10 by personnel, fabrication machinery and other external elements. Specifically, the intermediate wafer 20 may be built upon or attached to a handle wafer 44, by means of a release layer 42. The handle 44 is removable by etching away the release layer 42 after the direct copper bonding process as best shown in FIG. 2.

Turning now to FIG. 3, a method of fabricating an electro-optic semiconductor package is shown at 50 in accordance with one embodiment of the present invention. Generally, an IC wafer having one or more IC contact pads is provided at processing block 52. As already discussed, the IC contact pads are connected to an IC on the IC wafer. An intermediate wafer having one or more intermediate contact pads is provided at block 54, where the intermediate contact pads are connected to an electro-optic arrangement on the intermediate wafer. Processing block 56 provides for direct copper bonding the IC contact pads to adjacent intermediate contact pads such that the electro-optic semiconductor package results. In the preferred embodiment, the release layer is removed at block 58 in order to facilitate connection to any vias that may be present.

FIG. 4 illustrates the preferred approach to direct copper bonding the contact pads in greater detail at block 56. Specifically, the IC contact pads and the intermediate contact pads are cleaned at block 60. One approach to the cleaning process is to use an acid bath followed by a water rinse and spin-dry. Applicable cleaning processes are discussed in greater detail in "Copper Wafer Bonding", A. Fan et al., *Electrochemical and Solid State Letters*, 2 (10), pp. 534-36 (1999). Although the purpose of the acid bath is to remove any native oxide that exists on the metal surface of the contact pads, it has been determined that wafer bonding without surface preparation can also be achieved with reproducible results. Notwithstanding, processing block 62 provides for disposing the IC contact pads adjacent to the intermediate contact pads in an oxidation-resistant environment (such as nitrogen) having a predetermined ambient temperature. While the appropriate ambient temperature varies based on a number of factors, temperatures on the order of 390° C. have been demonstrated as being sufficient to support the bonding process. The IC contact pads are forced into direct contact with the adjacent intermediate contact pads at a predetermined pressure for a predetermined period of time at processing block 64 such that a direct copper bond results. It should be noted that as a result of the above-described process, adjacent contact pads become a single, continuous layer of copper as opposed to the copper-solder-copper interface obtained from C4 bonding and other conventional approaches. It should also be noted that the use of such a bond to reduce both optical and electrical losses represents a significant improvement over traditional approaches. Key performance metrics associated with direct copper bonding are discussed in "Comparison of Key Performance Metrics in Two- and Three-Dimensional Integrated Circuits", A. Rahman et al., *Microsystems Technology*, MIT, Cambridge, Mass.

Figure 5:
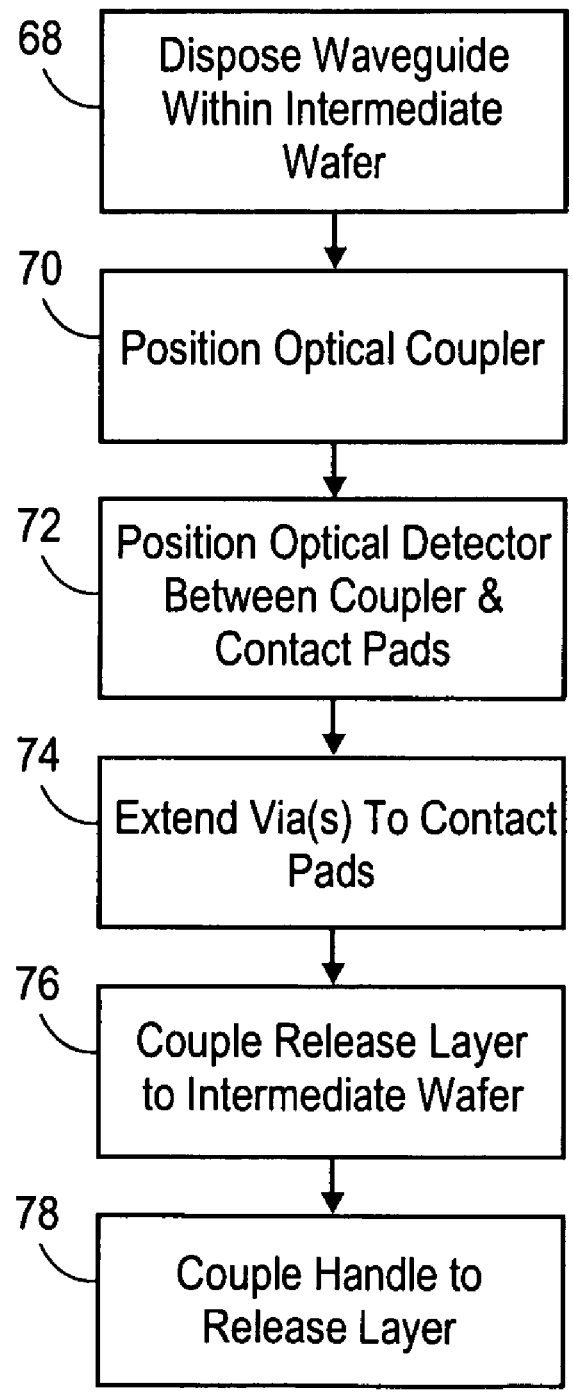
FIG. 5 is a flowchart of an example of a method of fabricating an intermediate wafer in accordance with one embodiment of the present invention.

Indeed, FIG. 5 demonstrates that the direct copper bond enables a unique approach to fabricating the intermediate wafer. For example, fabrication method 66 includes the processing block 68 of disposing a waveguide within the intermediate wafer. An optical coupler is positioned adjacent to the waveguide within the intermediate wafer at block 70 such that the coupler enables receipt of an optical signal from the waveguide. Processing block 72 provides for positioning an optical detector between the optical coupler and one or more intermediate contact pads of the intermediate wafer such that optical detector enables transfer of an electrical signal to the intermediate contact pads based on the optical signal. Thus, the optical detector can be placed on the intermediate wafer as opposed to the conventional approach of placing the detector on the IC wafer. By so doing, a number of advantages can be achieved For example, the optical losses that normally occur as a result of the C4 gap between the wafers are minimized. Furthermore, the electrical losses associated with transmitting electrical signals across the C4 bond are significantly reduced. Such losses include unwanted interconnect delay, resistance, capacitance, and loop inductance. It can further be seen that vias are extended through the intermediate wafer to one or more of the intermediate contact pads at block 74.

It should be noted that the order in which many of the processes described herein are preformed may vary depending on the circumstances. For example, manufacturing concerns may dictate that the vias be created before disposition of the waveguide, or that the optical detector be positioned before placement of the waveguide and optical coupler. It is also possible that the release layer is deposited on the handle wafer and the intermediate wafer 20 is built up over the handle wafer. In this approach, a base cladding layer would first be deposited, followed by deposition and definition of the waveguide material. The optical coupler 34 is defined, followed by the deposition and definition of the optical detector, and finally through via 40 definition and intermediate contact pad 22 definition.

Those skilled in the art can now appreciate from the foregoing description that the broad teachings of the present invention can be implemented in a variety of forms. Therefore, while this invention has been described in connection with particular examples thereof, the true scope of the invention should not be so limited since other modification will become apparent to the skilled practitioner upon a study of the drawings, specification, and following claims.

It is claimed that:

1. A method of fabricating an electro-optical semiconductor package, the method comprising:
   providing a processor wafer having one or more IC contact pads, the IC contact pads being connected to a computer processor on the processor wafer;
   coupling a release layer to a surface of an intermediate wafer;
   coupling a handle to the release layer;
   disposing a waveguide within the intermediate wafer;
   positioning an optical coupler adjacent to the waveguide within the intermediate wafer, the coupler enabling receipt of an optical signal from the waveguide;
   positioning an optical detector between the optical coupler and one or more intermediate contact pads, the optical detector enabling transfer of an electrical signal to the intermediate contact pads based on the optical signal;
   cleaning the contact pads in an acid bath;
   disposing the IC contact pads adjacent to the intermediate contact pads in an oxidation-resistant environment having a predetermined ambient temperature; and
   forcing the IC contact pads into direct contact with the intermediate contact pads at a predetermined pressure, a direct copper bond resulting.

2. The method of claim 1 further including removing the release layer after direct copper bonding the IC contact pads to the intermediate contact pads.

3. The method of claim 2 further including etching away the release layer.

* * * * *